US012763598B2

(12) United States Patent
Pancheri et al.

(10) Patent No.: US 12,763,598 B2
(45) Date of Patent: Oct. 13, 2026

(54) LOAD SHED SYSTEM

(71) Applicant: Generac Power Systems, Inc., Waukesha, WI (US)

(72) Inventors: Brendan Pancheri, Milwaukee, WI (US); Greg Wischstadt, Wales, WI (US); Robert Iles, Delafield, WI (US); Andy Phillips, Wind Lake, WI (US); Taesik Yu, Hwaseong-si (KR); Sungmin Lee, Oga-myeon (KR)

(73) Assignee: Generac Power Systems, Inc., Waukesha, WI (US)

( * ) Notice: Subject to any disclaimer, the term of this patent is extended or adjusted under 35 U.S.C. 154(b) by 0 days.

(21) Appl. No.: 18/886,777

(22) Filed: Sep. 16, 2024

(65) Prior Publication Data

US 2025/0088030 A1 Mar. 13, 2025

Related U.S. Application Data

(60) Continuation of application No. 18/488,720, filed on Oct. 17, 2023, now Pat. No. 12,119,705, which is a
(Continued)

(51) Int. Cl.
*G05D 3/12* (2006.01)
*G01R 11/04* (2006.01)
(Continued)

(52) U.S. Cl.
CPC .............. *H02J 9/061* (2013.01); *G01R 11/04* (2013.01); *G01R 11/06* (2013.01); *H02J 3/14* (2013.01);
(Continued)

(58) Field of Classification Search
CPC .......... H02J 9/061; H02J 3/14; H02J 2310/14; Y02B 70/30; Y02B 70/3225; Y04S 20/222; Y04S 20/248
See application file for complete search history.

(56) References Cited

U.S. PATENT DOCUMENTS 4,324,987 A 4/1982 Sullivan, II et al.
4,357,665 A 11/1982 Korff
(Continued)

FOREIGN PATENT DOCUMENTS

JP 5-91751 A 4/1993

OTHER PUBLICATIONS

Generac 50A Power Management Module, Owner's/Installation Manual Power Management Module (PMM) and Starter Kit, 14 pages, dated Feb. 20, 2013.
(Continued)

*Primary Examiner* — Ryan Johnson
*Assistant Examiner* — Esayas G Yeshaw
(74) *Attorney, Agent, or Firm* — Merchant & Gould P.C.

(57) ABSTRACT

A load shed module configured to be connected in series between a power supply and a load is disclosed. A separate load shed module is connected in series between each load and the power supply. The load shed module determines the frequency of the voltage supplied from the power supply. Based on the frequency, the load shed module determines if utility power is connected or if a generator is connected. If the generator is connected and the frequency of the voltage goes outside of a desired operating range for a preset time, the load shed module disconnects the load from the power supply. Each load shed module includes a priority setting and reconnects its corresponding load after a predetermined time corresponding to the priority setting.

20 Claims, 2 Drawing Sheets

Related U.S. Application Data continuation of application No. 17/388,120, filed on Jul. 29, 2021, now Pat. No. 11,831,197, which is a continuation of application No. 16/744,601, filed on Jan. 16, 2020, now Pat. No. 11,108,265, which is a continuation of application No. 15/608,046, filed on May 30, 2017, now Pat. No. 10,554,074, which is a division of application No. 14/593,058, filed on Jan. 9, 2015, now Pat. No. 10,069,331.

(51) Int. Cl.

| | |
|---|---|
| ***G01R 11/06*** | (2006.01) |
| ***H02J 3/14*** | (2006.01) |
| ***H02J 9/06*** | (2006.01) |
| *H02J 105/42* | (2026.01) |

(52) U.S. Cl.

CPC ........... *H02J 2105/42* (2026.01); *Y02B 70/30* (2013.01); *Y02B 70/3225* (2013.01); *Y04S 20/222* (2013.01); *Y04S 20/248* (2013.01)

(56) References Cited

U.S. PATENT DOCUMENTS

| | | | | |
|---|---|---|---|---|
| 5,462,225 | A | 10/1995 | Massara et al. | |
| 6,172,432 | B1 * | 1/2001 | Schnackenberg | H02J 9/066 307/64 |
| 6,314,378 | B1 | 11/2001 | Hodge et al. | |
| 6,476,519 | B1 | 11/2002 | Weiner | |
| 6,624,532 | B1 | 9/2003 | Davidow et al. | |
| 6,631,310 | B1 | 10/2003 | Leslie | |
| 6,671,586 | B2 * | 12/2003 | Davis | H02J 13/00017 700/295 |
| 6,747,368 | B2 | 6/2004 | Jarrett | |
| 6,832,135 | B2 | 12/2004 | Ying | |
| 6,891,478 | B2 | 5/2005 | Gardner | |
| 7,132,951 | B2 | 11/2006 | Ziejewski et al. | |
| 7,149,605 | B2 | 12/2006 | Chassin et al. | |
| 7,274,975 | B2 | 9/2007 | Miller | |
| 7,356,422 | B2 | 4/2008 | Schweitzer, III | |
| 7,460,930 | B1 | 12/2008 | Howell et al. | |
| 7,528,503 | B2 | 5/2009 | Rognil et al. | |
| 8,135,499 | B2 | 3/2012 | Haugh | |
| 8,204,632 | B2 | 6/2012 | Abi-Samra | |
| 8,248,203 | B2 | 8/2012 | Hanwright et al. | |
| 8,260,471 | B2 | 9/2012 | Storch et al. | |
| 8,324,755 | B2 | 12/2012 | Stair et al. | |
| 8,369,998 | B2 | 2/2013 | Drake et al. | |
| 8,373,569 | B2 | 2/2013 | Gilpatrick | |
| 8,410,633 | B2 | 4/2013 | Batzler et al. | |
| 8,417,393 | B2 | 4/2013 | Drake et al. | |
| 8,433,452 | B2 | 4/2013 | Fleck et al. | |
| 9,419,417 | B1 | 8/2016 | Taxter | |
| 9,887,546 | B2 | 2/2018 | Batzler et al. | |
| 10,069,331 | B2 | 9/2018 | Pancheri et al. | |
| 10,291,032 | B2 * | 5/2019 | Mumtaz | H02M 3/04 |
| 10,554,074 | B2 | 2/2020 | Pancheri et al. | |
| 10,574,053 | B2 | 2/2020 | Batzler et al. | |
| 10,698,433 | B2 | 6/2020 | Baba | |
| 10,879,727 | B1 | 12/2020 | Cooper | |
| 11,108,265 | B2 | 8/2021 | Pancheri et al. | |
| 11,831,197 | B2 | 11/2023 | Pancheri et al. | |
| 11,967,857 | B1 | 4/2024 | Cooper | |
| 12,119,705 | B2 | 10/2024 | Pancheri et al. | |
| 2002/0024332 | A1 | 2/2002 | Gardner | |
| 2002/0190576 | A1 | 12/2002 | Kern et al. | |
| 2003/0075982 | A1 | 4/2003 | Seefeldt | |
| 2004/0075343 | A1 | 4/2004 | Wareham et al. | |
| 2004/0254654 | A1 | 12/2004 | Donnelly et al. | |
| 2004/0262997 | A1 | 12/2004 | Gull et al. | |
| 2006/0018069 | A1 | 1/2006 | Gull et al. | |
| 2006/0028069 | A1 | 2/2006 | Loucks et al. | |
| 2006/0208574 | A1 | 9/2006 | Lasseter et al. | |
| 2007/0222294 | A1 | 9/2007 | Tsukida et al. | |
| 2007/0222295 | A1 | 9/2007 | Wareham et al. | |
| 2008/0258557 | A1 | 10/2008 | Lathrop et al. | |
| 2009/0216386 | A1 | 8/2009 | Wedel | |
| 2009/0240377 | A1 | 9/2009 | Batzler et al. | |
| 2010/0013308 | A1 | 1/2010 | Lathrop et al. | |
| 2010/0019574 | A1 | 1/2010 | Baldassarre et al. | |
| 2010/0038966 | A1 | 2/2010 | Espeut, Jr. | |
| 2010/0114387 | A1 | 5/2010 | Chassin | |
| 2011/0054707 | A1 | 3/2011 | Batzler et al. | |
| 2011/0054825 | A1 | 3/2011 | Perla et al. | |
| 2011/0156389 | A1 | 6/2011 | Gabeiras et al. | |
| 2011/0254370 | A1 | 10/2011 | Wischstadt et al. | |
| 2011/0320053 | A1 | 12/2011 | Dozier et al. | |
| 2012/0029717 | A1 | 2/2012 | Cox et al. | |
| 2012/0049638 | A1 | 3/2012 | Dorn et al. | |
| 2012/0053739 | A1 | 3/2012 | Brian et al. | |
| 2012/0074780 | A1 | 3/2012 | Fleck | |
| 2012/0104848 | A1 | 5/2012 | Lathrop et al. | |
| 2012/0109395 | A1 | 5/2012 | Finch et al. | |
| 2012/0175955 | A1 | 7/2012 | Carralero et al. | |
| 2012/0205986 | A1 | 8/2012 | Frampton et al. | |
| 2013/0026840 | A1 | 1/2013 | Arditi et al. | |
| 2013/0035887 | A1 | 2/2013 | Fan | |
| 2013/0077367 | A1 | 3/2013 | Zhu et al. | |
| 2013/0270908 | A1 | 10/2013 | Wedel et al. | |
| 2014/0070534 | A1 | 3/2014 | Hamano et al. | |
| 2014/0111006 | A1 | 4/2014 | Baldassarre et al. | |
| 2015/0143150 | A1 * | 5/2015 | Verdun | G06F 1/26 713/323 |
| 2016/0204651 | A1 * | 7/2016 | Pancheri | G01R 11/04 307/23 |
| 2017/0141610 | A1 | 5/2017 | Niaki | |
| 2017/0198681 | A1 | 7/2017 | Petri Ortega et al. | |
| 2017/0264097 | A1 | 9/2017 | Pancheri | |
| 2018/0026446 | A1 | 1/2018 | Gonzalez et al. | |
| 2023/0327456 | A1 * | 10/2023 | Farb | F03B 15/00 |

OTHER PUBLICATIONS

100 AMP Smart Energy Management System Model 1000 Installation and Service Manual, P/N 53-00997-000 Rev. A, IntellitecProducts, LLC, 15 pages (Jan. 28, 2008).

30A Smart Energy Management System Model 500 Installation and Service Manual, P/N 53-00912-000 Rev. A, Intellitec, 16 pages (Aug. 24, 2004).

50 AMP Smart Energy Management System Model 700 Installation and Service Manual, P/N 53-00894-000 Rev. J, Intellitec, 18 pages (Jul. 29, 2019).

50 AMP Smart Energy Management System Model 900 Installation and Service Manual, P/N 53-00684-200 Rev. D, Intellitec, 16 pages (Apr. 5, 2019).

Application Engineering—Transfer Switch Application Manual, Cummins Power Generation Inc., 3 pages (Copyright 2010).

Diesel Generator Set Model DFHB 60 Hz, S-1135m, Cummins Power Generation, 8 pages (Sep. 2006).

Digital Controls PowerCommand digital control technology, Cummins Power Generation Inc., 7 pages (Copyright 2007).

Digital Parallelling GenSet Model Operation/Service Manual, 900-0519D, Cummins Power Generation, 226 pages (Apr. 2005).

DLM Module Technical Manual, Revision A, 12 pages (Aug. 30, 2010).

Energy Command 30 Operator and Installation Manual, 900-0541, Issue 3, Cummins PN 018-01049 Rev 1.6c), Cummins Power Generation, 29 pages (Dec. 2007).

Generac Full Line Catalog, Bulletin 0172430SBY, Generac Power Systems, Inc., 20 pages (Mar. 2009).

Generac Modular Power System (MPS) MQT10, Bulletin 0171940SBY, Generac Power Systems, Inc., 4 pages (Aug. 2005).

Generac Modular Power System Insert, Bulletin 0171420SBY, Generac Power Systems, Inc., 2 pages (Feb. 2006).

H-100 Control Panel Technical Manual, Revision A, Generac Power Systems, Inc., 52 pages (Mar. 13, 2006).

Home Standby Generator Set GSAA (Spec A and C) Operator Manual, 983-0104 Issue 6, Cummins Power Generation, 69 pages (Nov. 2009).

(56) References Cited

OTHER PUBLICATIONS

Industrial Generator Sets Brochure, Bulletin 0184960SBY, Generac Power Systems, Inc., 11 pages (Mar. 2010).
Mahat et al., "Underfrequency Load Shedding for an Islanded Distribution System with Distributed Generators," IEEE Transactions on Power Delivery, vol. 25, No. 2, pp. 911-918 (Apr. 2010).
Mini Power Control System, 630-515-9100 Rev D, PrecisionCircuitsInc.com, 2 pages (Copyright date unknown).
Nexus LTS Load Shed Switch Technical Manual, Revision A, Generac Power Systems, Inc., 24 pages (Aug. 16, 2010).
Nexus Smart Switch Technical Manual, Revision A, Generac Power Systems, Inc., 20 pages (Apr. 22, 2010).
Onan Owner's Handbook for the world's most-trusted RV generators, Form F-1123, Cummins Power Generation, 35 pages (May 2005).
Power Control System 50A, 630-240-9832, PrecisionCircuitsInc.com, 4 pages (May 22, 2007).
Power Solutions 7—9000 kW Standby Generators, Bulletin 0172430SBY, Generac Power Systems, Inc., 24 pages (Jul. 2007).
PowerCommand 3.3 control system, Specification sheet, Cummins Power Generation Inc., 11 pages (Copyright 2008).
PowerCommand Control 3100 Series Generator Sets Operator's Manual, 960-0173B, Cummins Power Generation, 62 pages (Feb. 2004).
PowerCommand FT-10 Network LonWorks System Annuciator Installation Manual, 900-0293, Cummins Power Generation, 29 pages (Jan. 2003).
PowerCommand Paralleling System Digital MasterControl, Cummins Power Generation Inc., 7 pages (Copyright 2009).
PowerLine 2004 Energy Management System Installation and Service Manual, P/N 53-00911-000 Rev. B, Intellitec, 16 pages (Jul. 26, 2019).
PowerManager Parallel Controller (PM-PC) and PowerManager Generator Controller (PM-GC), Revision B, Generac Poewr Systems, Inc., 16 pages (Dec. 15, 2011).
Remote Network Monitoring PowerCommand iWatch 100 Operator and Installation Manual, 900-0545, Issue 3, Cummins Power Generation, 87 pages (Dec. 2007).
RTSS Load Shed Automatic Transfer Switch Technical Manual, Revision C, Generac Power Systems, Inc., 20 pages (Jun. 20, 2008).
Smart Energy Management System Model 600 Owners Guide, P/N 53-22100-200 Rev. A, Intellitec, 4 pages (Oct. 25, 2001).
Technical Perspective Generator Paralleling, Bulletin 0167140SBY, Generac Power Systems, Inc., 4 pages (May 2006).
Transfer Equipment Controls, Application Manual—Transfer Switches, Cummins Power Generation, pp. 38-48 (Copyright 2004).
Cummins Power Generation—How Load Management Works on your Cummins Power Generation Residential Generator; https://www.youtube.com/watch?v=i-RelpNUXNo; Uploaded on Nov. 18, 2010, 5 pages.

* cited by examiner

LOAD SHED SYSTEM

CROSS-REFERENCE TO RELATED APPLICATIONS

This application is a continuation of U.S. application Ser. No. 18/488,720, filed on Oct. 17, 2023, entitled LOAD SHED SYSTEM, which is a continuation of U.S. Application Ser. No. 17/388,120, filed on Jul. 29, 2021, issued as U.S. Pat. No. 11,831,197 on Nov. 28, 2023, entitled LOAD SHED SYSTEM, which is a continuation of U.S. application Ser. No. 16/744,601, filed on Jan. 16, 2020, issued as U.S. Pat. No. 11,108,265 on Aug. 31, 2023, entitled LOAD SHED SYSTEM, which is a continuation of U.S. application Ser. No. 15/608,046, filed on May 30, 2017, issued as U.S. Pat. No. 10,554,074 on Feb. 4, 2020, entitled LOAD SHED SYSTEM, which is a divisional of U.S. application Ser. No. 14/593,058, filed on Jan. 9, 2015, issued as U.S. Pat. No. 10,069,331 on Sep. 4, 2018, entitled LOAD SHED MODULE, the disclosures of which are hereby incorporated by reference in their entireties. To the extent appropriate a claim of priority is made to each of the above-disclosed applications.

FIELD OF THE INVENTION

The subject matter disclosed herein relates generally to a load shed module and, in particular, to an independent load shed module which can be connected to each load line and which requires no signal wires connected between modules or to a transfer switch.

BACKGROUND AND SUMMARY OF THE INVENTION

Electrical generators are used in a wide variety of applications. Typically, an individual electrical generator operates in a stand-by mode wherein the electrical power provided by a utility is monitored such that if the commercial electrical power from the utility fails, the engine of the electrical generator is automatically started causing the alternator to generate electrical power. When the electrical power generated by the alternator reaches a predetermined voltage and frequency desired by the customer, a transfer switch transfers the load imposed by the customer from the commercial power lines to the electrical generator. As is known, most residential electric equipment in the United States is designed to be used in connection with electrical power having a fixed frequency, namely, sixty (60) hertz (Hz).

Typically, electrical generators utilize a single driving engine coupled to a generator or alternator through a common shaft. Upon actuation of the engine, the crankshaft rotates the common shaft so as to drive the alternator that, in turn, generates electrical power. The frequency of the output power of most prior electrical generators depends on a fixed, operating speed of the engine. Typically, the predetermined operating speed of an engine for a two-pole, stand-by electrical generator is approximately 3600 revolutions per minute to produce the rated frequency and power for which the unit is designed.

The output power of a generator is, however, load dependent. As the electrical load on the generator increases, the frequency of the electricity output may decrease. Further, a sudden, significant change in load can cause the generator speed to drop several hertz, for example. If the generator has sufficient capacity to power the additional load, the generator controller regulates the speed and brings the output frequency back to the desired output frequency. If, however, the additional load exceeds the capacity of the generator, the generator may stall, resulting in none of the loads receiving power. For example, a generator may be running and providing power to lights and a television in one room. A sump pump, furnace, or another electrical load may be switched on, creating an additional power demand on the generator. The additional load may cause the engine to begin to slow and/or to stall.

Historically, it has been known to provide a load shed module which may be connected to the output of a transfer switch. The load shed module, therefore, receives power from the generator as an input. One or more sensors are utilized within the load shed module to monitor operation of the generator. Optionally, the load shed module may receive one or more signals from the generator as inputs providing an indication of the operation of the generator. The signals may indicate, for example, that the generator is providing power to the loads rather than utility power or that the generator is overloaded. The load shed module also includes a number of switches or contactors to connect load circuits to the generator. A central controller receives the signals from the sensors monitoring operation of the generator or the signals from the generator to determine whether the load circuits may be connected to the generator. If the generator begins to stall, the load shed module may disconnect a portion, or all, of the loads according to the load management routines programmed into the load shed module. However, such a load shed module requires a central controller interconnected with each of the switches. Further, installation of the load shed module requires routing the electrical conductors from all of the loads to the load shed module. Each load typically includes a hot conductor and a neutral conductor and may further include a ground conductor. Each of the electrical conductors must then be properly connected within the load shed module. Depending on the arrangement of the load shed module, only the hot conductors may be switched or both the hot and neutral conductors may be switched. Further, each load must be connected to the appropriate switch designated for that load. The varying potential configurations and multiple conductors from each of the loads increase the potential for a wiring error to occur during installation of the load shed module.

Therefore, it is a feature of the present invention to provide a load shed module with reduced installation complexity.

According to one embodiment of the invention, a load shed module is configured to be connected in series between a power source and a load. The load shed module includes an input configured to receive a first electrical connection from the power source, an output configured to provide a second electrical connection for the load, and a switch operatively connected in series between the input and the output. The switch receives a control signal to selectively open and close the switch. A sensor is configured to generate a feedback signal corresponding to an alternating current (AC) voltage present at the input, and a priority selector is operable to generate a priority signal for the load shed module. A controller is connected to the sensor to receive the feedback signal, to the priority selector to receive the priority signal, and to the switch to supply the control signal. The controller is operable to determine whether the power source is a utility power source or an alternate power source as a function of the feedback signal, compare the feedback signal to a threshold when the power source is the alternate power source, generate the control signal to open the switch when the feedback signal exceeds the threshold for a first predetermined time, and generate the control signal to close the switch when the power source is the alternate power source and when a second predetermined time has passed, where the second predetermined time is selected as a function of the priority signal.

According to another aspect of the invention, the controller is further operable to determine a frequency of the AC voltage present at the input from the feedback signal and determine whether the power source is the utility power source or the alternate power source as a function of the frequency of the AC voltage. The controller may store a minimum and maximum frequency of the AC voltage and determine a difference between the minimum and maximum frequencies. The threshold to open the switch may be a maximum difference between the minimum frequency and the maximum frequency. Optionally, the controller may determine a difference between the frequency of the AC voltage present at the input and an expected frequency of the AC voltage present at the input. The threshold may be a maximum difference between the frequency of the AC voltage present at the input and the expected frequency of the AC voltage present at the input.

According to yet another aspect of the invention, the controller may be configured to operate in a first operating mode and in a second operating mode. During the first operating mode, the controller generates the control signal to open the switch when the feedback signal exceeds the threshold for the first predetermined time. During the second operating mode, the controller generates the control signal to open the switch when the feedback signal exceeds the threshold for a third predetermined time, and the third predetermined time is less than the first predetermined time. The controller may also enter a lock out operating mode when the feedback signal exceeds the threshold for the third predetermined time.

According to another embodiment of the invention, a method of connecting a load to a power source in a power distribution system is disclosed. A feedback signal, corresponding to a voltage received at an input of a load shed module from the power source, is read. A frequency of the voltage is determined from the feedback signal with a controller in the load shed module and compared to a threshold frequency. A control signal is generated with the controller to open a switch connected in series between the input and an output of the load shed module when the frequency of the voltage at the input is outside of the threshold frequency for a first predetermined time. A priority level of the load shed module is determined and the control signal is generated with the controller to close the switch connected in series between the input and the output of the load shed module after a second predetermined time when the frequency of the voltage is within the threshold frequency, where the second predetermined time is a function of the priority level of the load shed module.

These and other objects, advantages, and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

The drawings furnished herewith illustrate a preferred construction of the present invention in which the above advantages and features are clearly disclosed as well as others which will be readily understood from the following description of the illustrated embodiment.

In the drawings.

DETAILED DESCRIPTION OF THE PREFERRED EMBODIMENTS

The various features and advantageous details of the subject matter disclosed herein are explained more fully with reference to the non-limiting embodiments described in detail in the following description.

Figure 1:
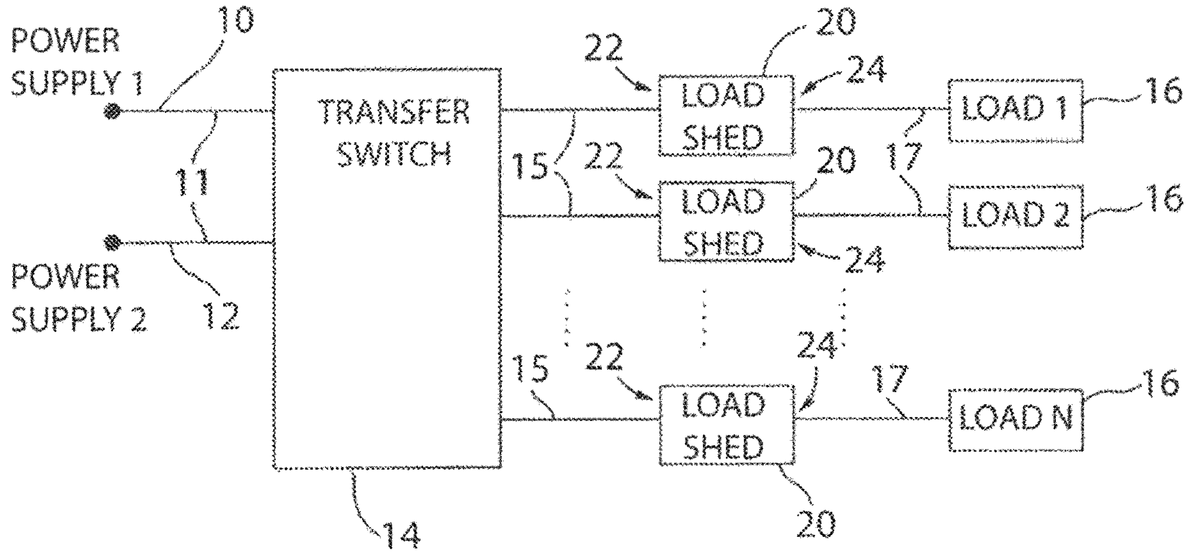
FIG. 1 is a block diagram representation of an exemplary power distribution system incorporating a load shed module according to one embodiment of the invention.

Referring to FIG. 1, a load distribution system incorporating load shed modules 20 according to one embodiment of the invention is illustrated. A transfer switch 14 selectively connects a first power supply 10 or a second power supply 12 to one or more electrical loads 16. The transfer switch 14 includes a first input configured to receive one or more electrical conductors from the first power supply 10 and a second input configured to receive one or more electrical conductors 11 from the second power supply 12. Each power supply 10, 12 may provide, for example, 120 VAC or 240 VAC via one or more hot leads and a neutral lead. Each of the hot leads and the neutral lead are defined by one of the electrical conductors 11 which may be bundled as a single electrical cable. A switch device in the transfer switch 14 is operable in a first mode to connect the first power supply 10 to each electrical load 16 and in a second mode to connect the second power supply 12 to one or more of the electrical loads 16. The switch device may be manually or automatically activated to selectively connect one of the power supplies 10, 12 to the loads 16. According to the illustrated embodiment, the transfer switch 14 includes a distribution system to supply power to multiple loads 16. The distribution system may include, for example, a series of conductive busses. Each hot lead from the power supplies 10, 12 is connected to a corresponding hot bus and the neutral lead from the power supplies 10, 12 is connected to a neutral bus. A load shed module 20 is connected in series between the transfer switch 14 and each load 16. At least one hot lead and a neutral lead are connected from each bus to the loads 16. A first load-side electrical conductor 15 is connected for each lead between the transfer switch 14 and the load shed module 20, and a second load-side electrical conductor 17 is connected for each lead between the load shed module 20 and each load 16.

Figure 2:
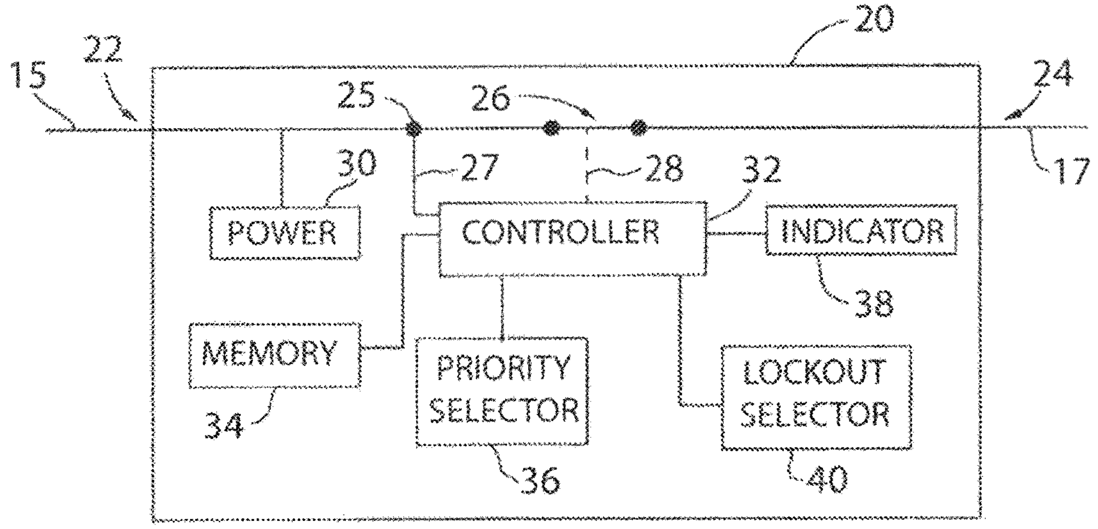
FIG. 2 is a block diagram representation of a load shed module according to one embodiment of the invention.

Referring next to FIG. 2, each load shed module 20 includes an input 22 configured to receive the first load-side electrical conductors 15 from the transfer switch and an output configured to connect to the second load-side electrical conductors 17 which is, in turn, connected to one of the loads 16. A switch 26 is connected between the input 22 and the output 24. The switch 26 may be an electronically activated, mechanical relay, a solid-state switch, or any other suitable switch according to the application requirements. The switch 26 includes at least two operating modes. In a first operating mode, the switch 26 connects the input 22 to the output 24 and establishes an electrical connection between the transfer switch 14 and the load 16. In a second operating mode, the switch 26 disconnects the input 22 from the output 24 and breaks the electrical connection between the transfer switch 14 and the load 16. As illustrated, separate load shed modules 20 are connected between the transfer switch 14 and each load 16.

The load shed module 20 also includes a power section 30. The power section 30 is connected to the input 22 and configured to receive power from either the first power supply 10 or the second power supply 12 according to which power supply 10, 12 the transfer switch 14 is connecting to the loads 16. Optionally, the load shed module 20 may include a battery connected to the power section 30. The power section 30 includes any power converters and/or voltage regulators that are required to provide power to each of the components in the load shed module 20.

The load shed module 20 further includes a controller 32 to control operation of the switch 26. The controller 32 may include discrete devices, such as operational amplifiers, logic devices, and the like. Optionally, the logic circuit may include one or more processors configured to operate separately or in parallel. Each processor may be a microprocessor or be implemented on a dedicated device, such as a field programmable gate array (FPGA) or application specific integrated circuit (ASIC). According to still another embodiment, the controller 32 may include a combination of discrete devices and a processor. The controller 32 is in communication with a memory device 34. The memory device 34 may be a single device or multiple devices and may include persistent memory, non-persistent memory, or a combination thereof. According to yet another embodiment of the invention, the memory device 34 may be incorporated on a single device with the controller 32. A sensor 25 is connected to the input 22 of the load shed module to generate a feedback signal 27 corresponding to the voltage present at the input 22. The feedback signal 27 is connected to the controller 32 and, as discussed in more detail below, is used to generate a control signal 28 used to cause the switch 26 to transition between operating modes. The load shed module 20 also includes a priority selector 36, configured to set a priority level for the load shed module 20; an indicator 38, configured to provide an audio and/or a visual indication of the operation of the load shed module 20; and a lockout selector 40, configured to manually enable and disable operation of the load shed module 20.

Figure 3:
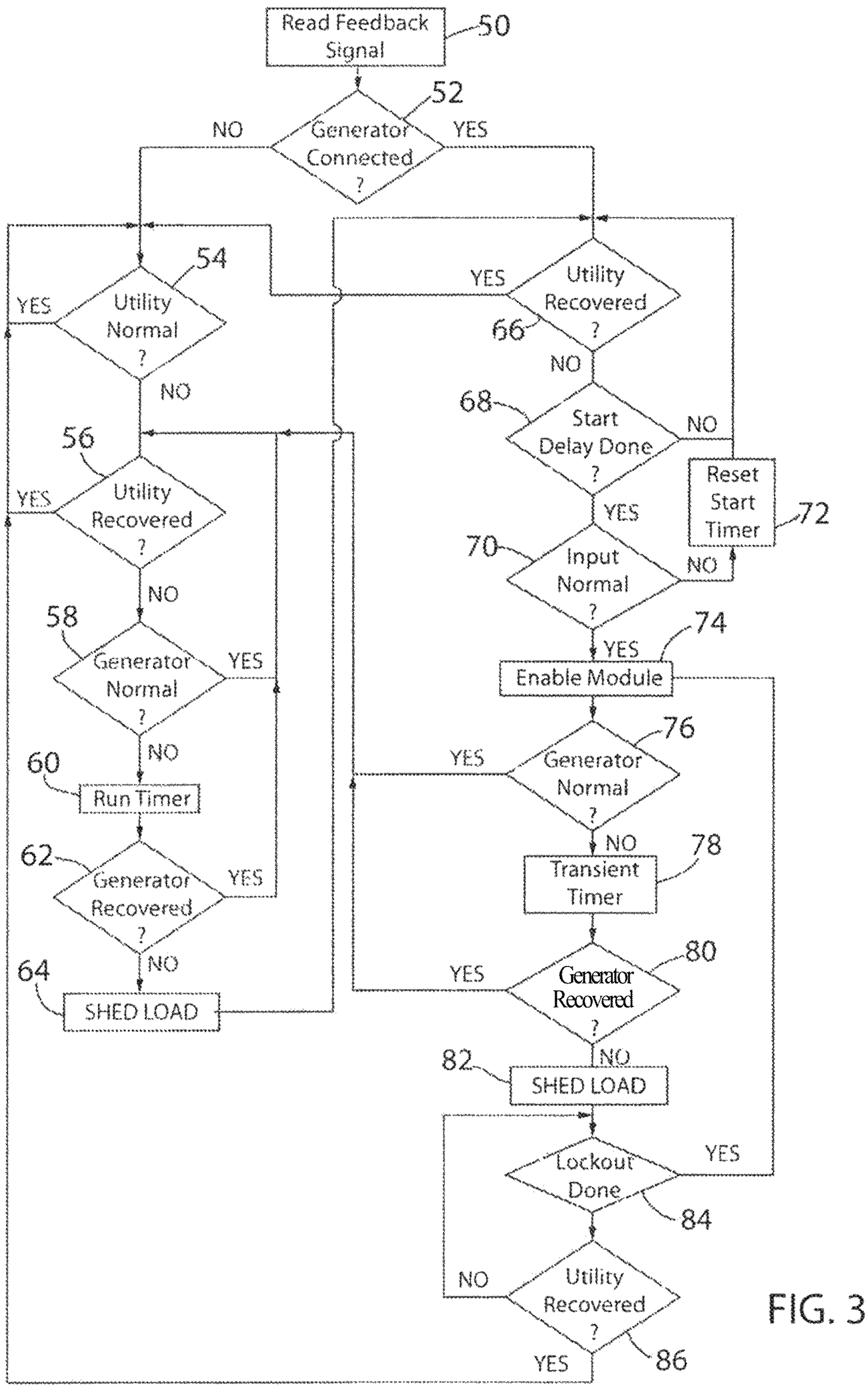
FIG. 3 is a flowchart graphically illustrating operation of one embodiment of the load shed module.

In operation, each load shed module 20 is operable to disconnect its respective load 16 without communicating with the other load shed modules 20 when a generator overload condition is detected. Referring next to FIG. 3, an exemplary sequence of steps for controlling operation of each load shed module 20 is illustrated. At step 50, the controller 32 reads the feedback signal 27 corresponding to the voltage present at the input 22 of the load shed module 20. The controller 32 may also store some or all of the values of the feedback signal 27 in the memory device 34. At startup, the controller 32 may stay at step 50 for an initial duration, such as five seconds. During the initial duration, the controller 32 stores values of the feedback signal 27 read at a periodic rate, such as once every microsecond, in the memory device 34. From the stored values, the controller 32 may determine, for example, a magnitude and/or frequency of the voltage present at the input 22 of the load shed module 20. A buffer may be defined in the memory device 34 which is filled during this initial duration and which, during subsequent operation, may become a first-in, first-out (FIFO) buffer. The controller 32 continually stores new values of the feedback signal 27 in the FIFO buffer while removing or over-writing the oldest values.

From the feedback signal 27, the controller 32 determines a frequency of the voltage present at the input 22 of the load shed module 20. The frequency may be determined, for example, by detecting minimum values, maximum values, or zero-crossings of the voltage present at the input 22 and determining the time between subsequent instances of the corresponding minimum value, maximum value, or zero-crossing. These values may be detected utilizing dedicated detection circuits or by inspection of the buffer in the memory device 34. Optionally, the controller 32 may utilize any other suitable method, as would be understood in the art, to determine the frequency of the voltage at the input 22 based on the measured values and a sequence of stored measurements of the voltage. The frequency value may be determined for each cycle of the voltage or may be filtered and/or averaged over multiple cycles of the voltage at the input 22. The controller 32 further saves a minimum frequency and a maximum frequency detected over a predefined duration, such as the duration of the FIFO buffer (e.g., a five second interval).

The controller 32 utilizes the frequency measurement of the input voltage to determine whether utility power or a backup generator is connected to the input 22 of the load shed module 20. When utility power is connected, the controller 32 expects a "stiff" input voltage, meaning that the frequency and amplitude of the voltage have little variation. According to one embodiment of the invention, the controller 32 may indicate that the utility is connected if the frequency remains within four tenths of a hertz (i.e., +/−0.4 Hz) of the expected frequency (e.g. 50 or 60 Hz). Preferably, the frequency remains within two hundredths of a hertz (i.e., +/−0.02 Hz). If the frequency of the measured input voltage remains within the expected frequency range, the controller 32 determines that the utility power is connected to the load shed module 20. When the backup generator is connected, the controller 32 expects a "soft" input voltage, meaning that the frequency and/or amplitude of the voltage may have greater variation than when the utility power is connected. According to one embodiment of the invention, the controller 32 expects the frequency to vary about seven-tenths of a hertz when the generator is connected to the input 22. At step 52, the controller 32 utilizes the frequency measurement and the expected stiff or soft input voltages to determine whether the generator is connected.

The controller 32 may utilize a short term variation in frequency, a long term variation in frequency, or a combination thereof to determine whether the generator is connected. In order to determine the variation in frequency, the controller 32 finds the difference between the minimum frequency and the maximum frequency as stored in the memory device 34. If the difference exceeds, for example, three-tenths of a hertz (+/−0.3 Hz) at any point during the predefined duration of frequency measurements, the controller 32 detects a short term deviation and indicates the generator is connected. Optionally, if the frequency measurement remains more than two-tenths of a hertz (+/−0.2 Hz) away from the nominal frequency (e.g., 50 or 60 Hz) for one second or more, the controller 32 detects a long term deviation and indicates the generator is connected. Thus, either a quick fluctuation in the frequency or a continuous drift away from the nominal frequency indicates that the generator is connected In some applications, the generator may have sufficient capacity and/or include internal control routines that regulate the output of the generator to provide a stiff output voltage. In these applications, the generator may be configured to generate an output voltage outside of the detection parameters at a periodic interval such that the load shed module 20 may detect that a generator is connected to the input 22 of the module 20.

If, at step 52, the controller 32 determines that the generator is not connected and, therefore, that the utility power is connected. At step 54, the controller 32 monitors the feedback signal 27 to determine whether the utility power is within normal operating parameters. The controller 32 may compare the frequency of the input voltage to a utility threshold to determine whether the input frequency is within an expected operating range when utility power is connected. According to one embodiment of the invention, the utility threshold is selected at two-tenths of a hertz (i.e., 0.2 Hz). If the frequency of the input voltage is outside of this range (i.e., +/−0.2 Hz) for a predefined time, such as one second, the controller 32 indicates that the utility input is not within normal operating parameters. Optionally, the controller 32 may monitor the difference between the minimum frequency and the maximum frequency of the measured input voltage. If the difference exceeds, for example, one-tenth of a hertz (i.e., 0.1 Hz), the controller 32 may also indicate that the utility is not within the normal operating parameters. As long as the utility remains within normal operating parameters, the controller 32 loops back to step 54 and continues to monitor operation of the utility input. While the utility power is within normal operating parameters and the controller 32 is monitoring operation of the utility power, the load shed module 20 may be considered to be in a running operating mode.

If the controller 32 detects that the utility input is outside of the normal operating parameters while in the running operating mode, the controller 32 determines whether the load shed module 20 may stay in a running operating mode or transition to a disconnected operating mode. At step 56, the controller 32 determines whether the utility input has recovered. The controller 32 may utilize the same criteria used at step 54 to determine whether utility power was within normal operating parameters, and when the feedback signal 27 indicates that the utility power is again operating normally, the controller loops back to step 54. While the utility power has failed or is outside of normal operating parameters, a backup generator, connected as the second power supply 12, and/or the transfer switch 14 may similarly be monitoring the utility voltage to detect failures in the utility power supply. The generator controller may start-up the generator and generate a signal to the transfer switch 14 to connect the second power supply 12 to the loads 16. Thus, at step 58, the controller 32 determines whether the generator is running within normal operating parameters. During the initial start-up of the generator, the generator may be outside of its normal operating parameters. Thus, at step 60, the controller 32 executes a run timer 60. At step 62, the controller 32 determines whether the generator has started up within the duration of the run-timer. If so, the controller 32 loops back to step 56 to monitor for the utility power being reestablished and to monitor that the generator remains within normal operating parameters. Thus, the controller 32 may keep the loads 16 connected and remain in the running operating mode during a transition from the first power supply 10 (e.g., utility power) to the second power supply 12 (e.g., a backup generator).

While the generator is running and the load shed module 20 is in the running operating mode, the controller 32 monitors the input feedback signal 27 to verify that the generator is within normal operating parameters. If, for example, a sudden change in the loads 16 occurs, the speed of the generator and, subsequently, the frequency of the output voltage may change. If a load 16 is added, the speed of the generator may slow down and, if a load 16 of sufficient magnitude is added, the generator may stall. If a small change in the frequency of the feedback signal 27 is detected, a small change in the loads 16 may be indicated and it is likely the generator will be able to resume normal operation. If a large change in the frequency of the feedback signal 27 is detected, a large change in the loads 16 may be indicated and the generator may or may not be able to resume normal operation. Thus, the controller 32 may allow a small change in the output frequency to continue without shedding a load 16 for a longer duration than if a large change in the frequency of the feedback signal 27 is detected. According to one embodiment of the invention, if, at step 58, the controller 32 detects that the frequency of the feedback signal 27 has dropped at least two hertz (e.g., less than 58 Hz for a 60 Hz nominal frequency), the run timer may be executed with a first duration, such as three and one-half seconds. If, at step 58, the controller 32 detects that the frequency of the feedback signal 27 has dropped more than eight hertz (e.g., less than 52 Hz for a 60 Hz nominal frequency), the run timer may be executed with a second duration, such as one second. If at the end of the run timer, the controller 32 detects that the generator has recovered such that the frequency of the feedback signal 27 is within two hertz or within eight hertz, the controller 32 returns to step 56. If, however, the controller 32 detects that the frequency of the feedback signal 27 remains outside the normal operating range for the generator, the controller 32 generates the control signal 28 to open the switch and shed the load 16 connected to the load shed module 20, as indicated at step 64.

Upon shedding the load 16, the load shed module 20 enters a waiting operating condition. The waiting operating condition may similarly be entered during the initial power-up of the load shed module 20 or if the controller 32 detects that the generator is connected rather than utility power being connected at step 52. At step 66, the controller 32 evaluates the feedback signal 27 to determine whether the utility power supply has returned to normal operating conditions. The controller 32 may utilize the same criteria used at step 54 to determine whether utility power was within normal operating parameters, and when the feedback signal 27 indicates that the utility power is again operating normally, the controller loops back to step 54. If the load shed module 20 is in the waiting operating condition and the utility power has not returned to normal, a start delay is executed. According to one embodiment of the invention, the delay is equal to five minutes plus an extra interval set according to the priority level of the load shed module 20. The priority level is set according to the priority selector 36. The priority selector 36 may be, for example, a series of DIP switches, a multi-position selector switch, a voltage divider circuit generating a known reference voltage, or any other suitable device to provide an input to the controller 32 corresponding to a desired priority level. According to one embodiment of the invention, the priority selector 36 may be configurable in the field. Optionally, the priority selector may be configured by a technician prior to installation. The controller 32 may read a duration from the memory device 34 as a function of the priority level input. For example, a look-up table may be stored in the memory device 34 storing different start-up durations for each priority level. Optionally, the controller 32 may use a fixed duration and multiply the fixed duration times the priority level. For example, a fixed duration of five seconds may be used. If the priority level of the load shed module 20 is one, the total duration is five seconds, and if the priority level of the load shed module 20 is two, the total duration is ten seconds, and so on for increasing priority levels. While the start-up delay is executing, the load shed module 20 remains in the waiting operating condition and executes steps 66 and 68.

When the start-up delay is done executing, the controller 32 checks the feedback signal 27 to determine whether the frequency of the voltage at the input 22 of the load shed module is within a normal operating range, as shown in step 70. According to one embodiment of the invention, the controller 32 checks that the frequency of the feedback signal 27 is at least within two hertz of the nominal frequency (i.e., >=58 Hz for a 60 Hz nominal frequency). If the frequency of the feedback signal 27 is more than two hertz below the nominal frequency, the controller 32 determines that the generator is not operating normally and resets the start timer, as shown in step 72. The load shed module 20 may remain in the waiting operating mode until it detects either that one of the power supplies 10, 12 (e.g., the utility power or the generator) are operating within normal operating parameters. Once the controller 32 detects that one of the power supplies 10, 12 is operating within normal operating parameters, the controller 32 generates the control signal 28 to close the switch 26 connecting the load 16 at the output 24 of the load shed module 20 to the power supply 10, 12 connected to the input 22, as shown in step 74. After enabling the load shed module 20, the controller 32 then enters a transitional operating mode.

In the transitional operating mode, the controller 32 verifies that the load 16 which was just connected to the power supply 10, 12 does not negatively impact operation of the power supply 10, 12. In particular, the controller 32 verifies that a step change in load 16 when a generator is connected to the load shed module 20 does not cause the generator to slow excessively or stall. At step 76, the controller 32 monitors the feedback signal 27 to determine whether the generator is within normal operating parameters. The detection sequence is similar to that discussed above with respect to step 58. If a small change in the frequency of the feedback signal 27 is detected, a small change in the loads 16 may be indicated and it is likely the generator will be able to resume normal operation. If a large change in the frequency of the feedback signal 27 is detected, a large change in the loads 16 may be indicated and the generator may or may not be able to resume normal operation. Thus, the controller 32 may allow a small change in the output frequency to continue without shedding a load 16 for a longer duration than if a large change in the frequency of the feedback signal 27 is detected. According to one embodiment of the invention, if, at step 76, the controller 32 detects that the frequency of the feedback signal 27 has dropped at least two hertz (e.g., less than 58 Hz for a 60 Hz nominal frequency), the transient timer (step 78) may be executed with a first duration. If, at step 76, the controller 32 detects that the frequency of the feedback signal 27 has dropped more than eight hertz (e.g., less than 52 Hz for a 60 Hz nominal frequency), the transient timer (step 78) may be executed with a second duration. During the transitional operating mode, the first and second durations of the transient timers are configured to be shorter than the first and second durations of the run timers. According to one embodiment of the invention, the first and second duration of the transient timer is one-half second shorter than the corresponding duration of the run timer. As a result, if one or more load shed modules 20 have already connected their respective loads 16 to the power supply 10, 12, the timer executing in the load shed module 20 that has most recently connected its load 16 to the power supply 10, 12 will complete prior to the timers executing in the load shed modules 20 that have previously connected loads 16. Thus, the additional load 16 that results in generator operation outside of its normal operating range is removed prior to other loads 16 being removed. At step 80, the controller 32 checks whether the generator has recovered from the additional load 16. If the controller 32 detects that the generator has recovered such that the frequency of the feedback signal 27 is within two hertz or within eight hertz, the controller 32 switches from the transitional operating mode to the running operating mode and begins execution at step 56. If, however, the controller 32 detects that the frequency of the feedback signal 27 remains outside the normal operating range for the generator, the controller 32 generates the control signal 28 to open the switch and shed the load 16 connected to the load shed module 20, as indicated at step 82.

In order to prevent repeated attempts to connect a load 16 to the generator that will result in an undesirable performance of the generator, the load shed module 20 enters a lock out operating mode after shedding a load during the transitional operating mode. As shown in steps 84 and 86, the lock out operating mode executes a delay loop to prevent another connection attempt. A lock out timer is executed that has, for example, a one-half hour duration. At step 84, the controller 32 determines whether the lock out timer has completed execution. If not, the controller 32 also determines whether the feedback signal 27 indicates the utility power supply has resumed normal operation, as shown in step 86. If neither condition has occurred, the controller 32 loops back to step 84 to again check whether the lock out time is done executing. When the lock out time is done executing, the controller 32 returns to step 74 and again generates the control signal 28 to close the switch 26 and again attempt to connect the load 16 to the power supply connected to the load shed module 20. The additional delay time from the lock out timer may permit, for example, the combination of loads 16 present to change such that the load 16 connected to the load shed module 20 exiting the lock out operating mode to be successfully connected to the power supply. If during the execution of the lock out timer, the utility power supply recovers, the controller 32 may switch from the lock out operating mode to the running operating mode and continue execution at step 54. Further, a manual lockout selector 40 may be used to keep the load shed module 20 in the lock out operating mode such that the controller 32 continually generates a control signal 28 which opens the switch 26 between the input 22 and the output 24. The sequence of steps described above with respect to FIG. 3, describe one embodiment of the present invention. It is understood that various steps may be executed in different orders, for different durations, and using different thresholds without deviating from the scope of the invention.

With reference again to FIG. 1, multiple load shed modules 20 are provided in a load distribution system. Each load shed module 20 is connected between the transfer switch 14 and one of the loads 16 in the system. Each of the load shed modules 20 executes the series of steps discussed above with respect to FIG. 3 independently of the other. However, each load shed module 20 is monitoring the same voltage at its respective input 22 and, therefore, receives the same variations in conditions and/or transitions between power supplies 10, 12. Although there may be some variation in time for execution of individual steps due, for example, to manufacturing tolerances in sensing circuits and clock signal generation, each load shed module 20 ends up executing the steps at generally the same time. As a result, the priority level at which each load shed module 20 is set will cause the load shed module to enable its respective load 16 at a different time than the other load shed modules 20. It is contemplated that a set of load shed modules 20 may be configured for each distribution system where the priority selector 36 for each load shed module 20 is set to a different priority level. Optionally, multiple load shed modules 20 may be set to the same priority level if the total value of the loads 16 connected to each load shed module 20 is not expected to have a negative impact on the generator. According to still another embodiment of the invention, the priority selectors 36 may be configurable in the field and the priority level set when the load shed modules 20 are installed.

Because each load shed module 20 executes independently, it may be installed independently of the other modules 20 as well. It is contemplated that all of the load shed modules 20 may be installed at a common location, for example, proximate to a distribution panel at which utility power enters a facility and proximate to a transfer switch receiving the utility power and the input from a backup generator. Optionally, one or more of the load shed modules 20 may be mounted proximate to the load 16 to which it is to be connected. For example, the load shed module 20 may be connected next to an electrical connection for a furnace, oven, or other electronic device. Because the transfer switch 14 controls which power supply 10, 12 is connected to the load shed module 20 and the load shed module 20 monitors the voltage at the input 22 to determine which power supply is connected, the load shed module 20 needs no control signal from the transfer switch, generator, or other system controller. Similarly, the differing priority levels permit each load shed module 20 to execute without communication between other load shed modules 20.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

What is claimed is:

1. A load shed module configured to be connected between a power source and a load, the load shed module comprising:

- an input configured to receive a first electrical connection from the power source;
- an output configured to provide a second electrical connection for the load;
- a switch connected between the input and the output;
- a controller, the controller being operable to:
  - determine whether the power source is a utility power source or an alternate power source as a function of the frequency of the AC voltage received at the input; and
  - close the switch after a first delay period when the frequency of the AC voltage received at the input indicates that the power source is the alternate power source; and
- a housing within which the controller and the switch are housed.

2. The load shed module of claim 1, wherein the controller is further operable to open the switch when the frequency of the AC voltage received at the input from the alternate power source is below a frequency threshold.

3. The load shed module of claim 1, further comprising a power section connected to the input.

4. The load shed module of claim 1, wherein upon closing the switch after the first delay period, the controller is further operable to open the switch if the frequency of the AC voltage received at the input from the alternate power source is below a frequency threshold.

5. The load shed module of claim 1, wherein upon closing the switch after the first delay period, the controller is further operable to open the switch if the frequency of the AC voltage received at the input from the alternate power source is below a frequency threshold for a predefined duration.

6. The load shed module of claim 1, wherein the first delay period is a function of a priority level of the load shed module.

7. The load shed module of claim 5, wherein after opening the switch, the controller is further operable to close the switch again after a second delay period.

8. The load shed module of claim 1, wherein the power source is determined to be a backup power source if the difference between a maximum detected frequency of the AC voltage and a minimum detected frequency of the AC voltage over a predefined duration is greater than a first threshold.

9. The load shed module of claim 1, further comprising a manual lockout selector.

10. The load shed module of claim 1, wherein the load shed module does not include signal wires connected to the load shed module.

11. A method of connecting a load to a power source in a power distribution system comprising the steps of:

- receiving a first electrical connection at an input of a load shed module from the power source;
- determining, using a controller of the load shed module, whether the power source is a utility power source or an alternate power source as a function of the frequency of the AC voltage received at the input; and
- closing a switch in the load shed module after a first delay period when the frequency of the AC voltage received at the input indicates that the power source is the alternate power source.

12. The method of claim 11, further comprising opening the switch when the frequency of the AC voltage received at the input from the alternate power source is below a frequency threshold.

13. The method of claim 11, further comprising selecting a priority level of the load shed module.

14. The method of claim 13, wherein the first delay period is a function of the priority level of the load shed module.

15. The method of claim 11, wherein upon closing the switch after the first delay period, opening the switch if the frequency of the AC voltage received at the input from the alternate power source is below a frequency threshold.

16. The method of claim 11, wherein upon closing the switch after the first delay period, opening the switch if the frequency of the AC voltage received at the input from the alternate power source is below a frequency threshold for a predefined duration.

17. The method of claim 15, wherein after opening the switch, closing the switch again after a second delay period.

18. The method of claim 11, wherein the power source is determined to be a backup power source if the difference between a maximum detected frequency of the AC voltage and a minimum detected frequency of the AC voltage over a predefined duration is greater than a first threshold.

19. The method of claim 11, wherein the load shed module does not include signal wires connected to the load shed module.

20. The method of claim 11, wherein the load shed module further comprises a manual lockout selector.

* * * * *